(12) United States Patent
Briggs et al.

(10) Patent No.: US 11,574,864 B2
(45) Date of Patent: *Feb. 7, 2023

(54) SEMICONDUCTOR DEVICE INCLUDING A POROUS DIELECTRIC LAYER, AND METHOD OF FORMING THE SEMICONDUCTOR DEVICE

(71) Applicant: Tessera LLC, San Jose, CA (US)

(72) Inventors: Benjamin D. Briggs, Waterford, NY (US); Lawrence A. Clevenger, Rhinebeck, NY (US); Bartlet H. Deprospo, Goshen, NY (US); Huai Huang, Saratoga, NY (US); Christopher J. Penny, Saratoga Springs, NY (US); Michael Rizzolo, Albany, NY (US)

(73) Assignee: Tessera LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/341,112

(22) Filed: Jun. 7, 2021

(65) Prior Publication Data

US 2021/0335706 A1  Oct. 28, 2021

Related U.S. Application Data

(60) Division of application No. 16/817,491, filed on Mar. 12, 2020, now Pat. No. 11,056,429, which is a
(Continued)

(51) Int. Cl.
*H01L 23/522* (2006.01)
*H01L 21/768* (2006.01)
*H01L 23/532* (2006.01)

(52) U.S. Cl.
CPC ...... *H01L 23/5226* (2013.01); *H01L 21/7682* (2013.01); *H01L 21/7684* (2013.01); *H01L 21/76802* (2013.01); *H01L 21/76819* (2013.01); *H01L 21/76829* (2013.01); *H01L 21/76834* (2013.01); *H01L 21/76843* (2013.01); *H01L 21/76877* (2013.01); *H01L 23/5329* (2013.01); *H01L 23/53219* (2013.01); *H01L 23/53223* (2013.01); *H01L 23/53233* (2013.01); *H01L 23/53238* (2013.01); *H01L 21/76825* (2013.01);
(Continued)

(58) Field of Classification Search
None
See application file for complete search history.

(56) References Cited

U.S. PATENT DOCUMENTS 6,140,252 A  10/2000  Cho et al.
6,156,651 A  12/2000  Havemann
(Continued)

OTHER PUBLICATIONS

Office Action for U.S. Appl. No. 16/817,491, dated Nov. 25, 2020, Briggs, "Semiconductor Device including a Porous Dielectric Layer, and Method of Forming the Semiconductor Device", 12 pages.

*Primary Examiner* — Alexander G Ghyka
(74) *Attorney, Agent, or Firm* — Haley Guiliano LLP

(57) ABSTRACT

A semiconductor device includes a porous dielectric layer including a recessed portion, a conductive layer formed in the recessed portion, and a cap layer formed on the porous dielectric layer and on the conductive layer in the recessed portion, an upper surface of the porous dielectric layer being exposed through a gap in the cap layer.

21 Claims, 10 Drawing Sheets

Related U.S. Application Data continuation of application No. 16/421,587, filed on May 24, 2019, now Pat. No. 10,629,529, which is a division of application No. 16/049,442, filed on Jul. 30, 2018, now Pat. No. 10,366,952, which is a continuation of application No. 15/908,377, filed on Feb. 28, 2018, now Pat. No. 10,109,579, which is a division of application No. 15/199,321, filed on Jun. 30, 2016, now Pat. No. 9,997,451.

(52) U.S. Cl.
CPC .. *H01L 21/76828* (2013.01); *H01L 21/76832* (2013.01); *H01L 21/76883* (2013.01); *H01L 23/53252* (2013.01); *H01L 2221/1047* (2013.01)

(56) References Cited

U.S. PATENT DOCUMENTS

| | | |
|---|---|---|
| 6,541,842 B2 | 4/2003 | Meynen et al. |
| 7,015,150 B2 | 3/2006 | Cooney, III et al. |
| 7,088,003 B2 | 8/2006 | Gates et al. |
| 7,169,715 B2 | 1/2007 | Ott et al. |
| 7,605,073 B2 | 10/2009 | Lavoie et al. |
| 7,838,440 B2 | 11/2010 | Park |
| 8,492,239 B2 | 7/2013 | Bruce et al. |
| 8,828,489 B2 | 9/2014 | Dubois et al. |
| 9,368,362 B2 | 6/2016 | Rha et al. |
| 9,685,366 B1 | 6/2017 | Briggs et al. |
| 9,997,451 B2 * | 6/2018 | Briggs ................ H01L 23/5226 |
| 10,109,579 B2 | 10/2018 | Briggs et al. |
| 10,366,952 B2 | 7/2019 | Briggs et al. |
| 10,629,529 B2 * | 4/2020 | Briggs .............. H01L 21/76877 |
| 2003/0111263 A1 | 6/2003 | Fornof et al. |
| 2005/0040532 A1 | 2/2005 | Kumar et al. |
| 2008/0010690 A1 | 1/2008 | Delapierre |
| 2008/0188074 A1 | 8/2008 | Chen et al. |
| 2008/0286966 A1 | 11/2008 | Hohage et al. |
| 2009/0104774 A1 | 4/2009 | Furukawa et al. |
| 2010/0311895 A1 | 12/2010 | Dubois et al. |
| 2010/0314774 A1 | 12/2010 | Zhang et al. |
| 2012/0308735 A1 | 12/2012 | Dimitrakopoulos et al. |
| 2013/0130498 A1 | 5/2013 | Feustel et al. |
| 2016/0293547 A1 | 10/2016 | Rha et al. |
| 2020/0388568 A1 | 12/2020 | Briggs et al. |

* cited by examiner

SEMICONDUCTOR DEVICE INCLUDING A POROUS DIELECTRIC LAYER, AND METHOD OF FORMING THE SEMICONDUCTOR DEVICE

CROSS-REFERENCE TO RELATED APPLICATIONS

The present application is a divisional of and claims priority to U.S. patent application Ser. No. 16/817,491, filed Mar. 12, 2020, which is a continuation of U.S. patent application Ser. No. 16/421,587, filed May 24, 2019, now U.S. Pat. No. 10,629,529, issued Apr. 21, 2020, which is a divisional of U.S. patent application Ser. No. 16/049,442, filed Jul. 30, 2018, now U.S. Pat. No. 10,366,952, issued Jul. 30, 2019, which is a continuation of U.S. patent application Ser. No. 15/908,377, filed Feb. 28, 2018, now U.S. Pat. No. 10,109,579, issued Oct. 23, 2018, which is a divisional of U.S. patent application Ser. No. 15/199,321, filed Jun. 30, 2016, now U.S. Pat. No. 9,997,451, issued Jun. 12, 2018, each of which are incorporated herein by reference in their entirety for all purposes.

BACKGROUND OF THE INVENTION

Field of the Invention

The present invention relates to a semiconductor device including a porous dielectric layer and more particularly, to a semiconductor device including a porous dielectric layer and a conformal cap layer formed on the porous dielectric layer, an upper surface of the porous dielectric layer being exposed through a gap in the conformal cap layer.

Description of the Related Art

Porous dielectric materials (e.g., ultra low-k dielectric materials) are commonly used to form interlayer dielectrics (ILDs) such as those existing between metal lines. These materials allow interconnect signals to travel faster through conductors due to a concomitant reduction in resistance-capacitance (RC) delays.

However, the porosity of these materials makes them susceptible to damage due to chemical mechanical polishing (CMP), plasma exposures (e.g., reactive ion etch (RIE), strip, dielectric barrier etch) and wet cleans (e.g., post RIE dilute hydrofluoric (DHF) cleans). This leads to degradation of the dielectric break down strength (e.g., time dependent dielectric breakdown (TDDB)), degradation of the leakage characteristics of the dielectric (e.g., higher leakage), and higher capacitance.

FIGS. 1A-1B provide graphs illustrating the damaging effects of fabrication processing (e.g., CMP) on dielectric material (e.g., porous dielectric material).

In particular, FIG. 1A illustrates the effect of CMP on the capacitance of the dielectric material, in a related art fabrication process. As illustrated in FIG. 1A, the capacitance of the high porosity dielectric material was lower than low porosity dielectric at pristine condition, but it is significantly increased after CMP process.

Similarly, FIG. 1B illustrates the effect of CMP on the index of refraction (Rin) for the dielectric material, in a related art fabrication process. As illustrated in FIG. 1B, the index of refraction of the high porosity dielectric material and the low porosity dielectric material, post CMP is significantly greater than the capacitance of the materials as deposited.

Various related art methods are used to avoid damage to porous dielectric materials caused by processing. Pore sealing is one such related art method. In one pore sealing approach, an additional layer is interposed between the interlayer dielectric (ILD) and the barrier layer. Another pore-sealing approach uses templating porogens to avoid damage to the porous dielectric materials.

SUMMARY

In view of the foregoing and other problems, disadvantages, and drawbacks of the aforementioned related art devices and methods, an exemplary aspect of the present invention is directed to a method of forming a semiconductor device which protects the porous dielectric material from damage caused by subsequent processing, and maintains a low dielectric constant of the porous dielectric material.

An exemplary aspect of the present invention is directed to a semiconductor device including a porous dielectric layer formed on an interconnect layer and including a recessed portion, a conductive layer formed in the recessed portion, and a conformal cap layer formed on the porous dielectric layer and on the conductive layer in the recessed portion, an upper surface of the porous dielectric layer being exposed through a gap in the conformal cap layer.

Another exemplary aspect of the present invention is directed to a method of forming a semiconductor device. The method includes forming a conductive layer in a recessed portion of a pore-filled dielectric layer, partially removing a top portion of the conductive layer while maintaining a height of the pore-filled dielectric layer, forming a conformal cap layer on the pore-filled dielectric layer and the conductive layer in the recessed portion, polishing the conformal cap layer to form a gap in the conformal cap layer, such that an upper surface of the pore-filled dielectric layer is exposed through the gap, and an upper surface of the conductive layer is protected by the cap layer, and performing a heat treatment to burn out a pore filler of the pore-filled dielectric layer through the exposed upper surface of the pore-filled dielectric layer.

Another exemplary aspect of the present invention is directed to a method of forming a semiconductor device. The method includes forming a pore-filled dielectric layer on an interconnect layer, forming a recessed portion in the pore-filled dielectric layer, depositing a metal on the pore-filled dielectric layer and in the recessed portion, polishing the metal and the pore-filled dielectric layer, etching the metal in the recessed portion and the pore-filled dielectric layer to form a metal layer in the recessed portion, forming a conformal cap layer on the etched pore-filled dielectric layer and the etched metal in the recessed portion, polishing the conformal cap layer to form a gap in the conformal cap layer, such that an upper surface of the pore-filled dielectric layer is exposed through the gap, the gap comprising a length which is greater than an average pore diameter of the pores the porous dielectric layer, and performing a heat treatment to burn out a pore filler of the pore-filled dielectric layer through the exposed upper surface of the pore-filled dielectric layer, a temperature of the heat treatment being in a range from 200° C. to 450° C., and duration of the heat treatment being in a range from 1 minute to 30 minutes.

With its unique and novel features, the present invention provides a method of forming a semiconductor device which protects the porous dielectric material from damage caused by subsequent processing, and maintains a low dielectric constant of the porous dielectric material.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1A:
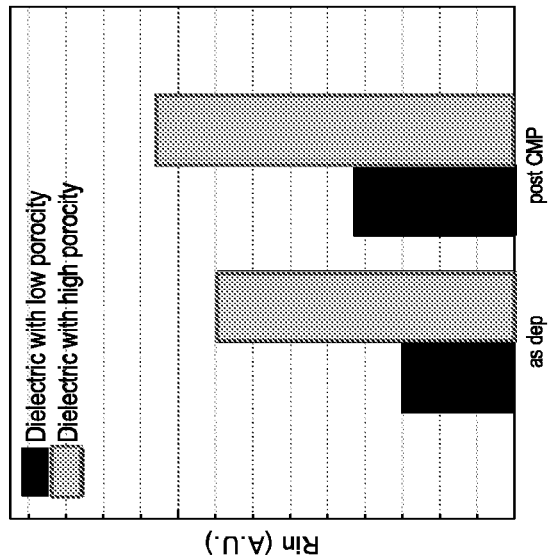
FIG. 1A illustrates the effect of CMP on the capacitance of the dielectric material, in a related art fabrication process.
Figure 1B:
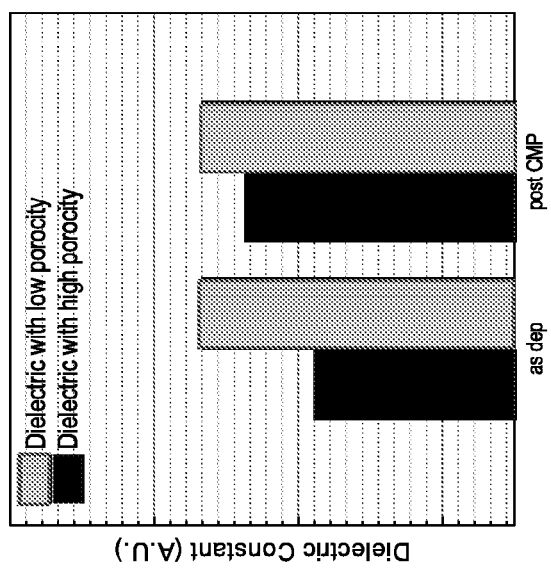
FIG. 1B illustrates the effect of CMP on the index of refraction (Rin) for the dielectric material, in a related art fabrication process.

Referring now to the drawings, FIGS. 2-4H illustrate the exemplary aspects of the present invention.

Porous low dielectric constant (low-k) materials were used to reduce the capacitance of the interconnects of integrated circuits. The dielectric constant goes lower when the porosity increases. However, the high porosity of the dielectric material makes it prone to process induce damage (PID), such as RIE and CMP. The dielectric constant raise back after damage and causing serious performance and reliably issues. Therefore, it is desirable to provide a simple and effective method of forming a semiconductor device which protects the porous dielectric material from damage caused by processing, and maintains the low dielectric constant (e.g., less than 2.4) of the porous dielectric material.

Figure 2:
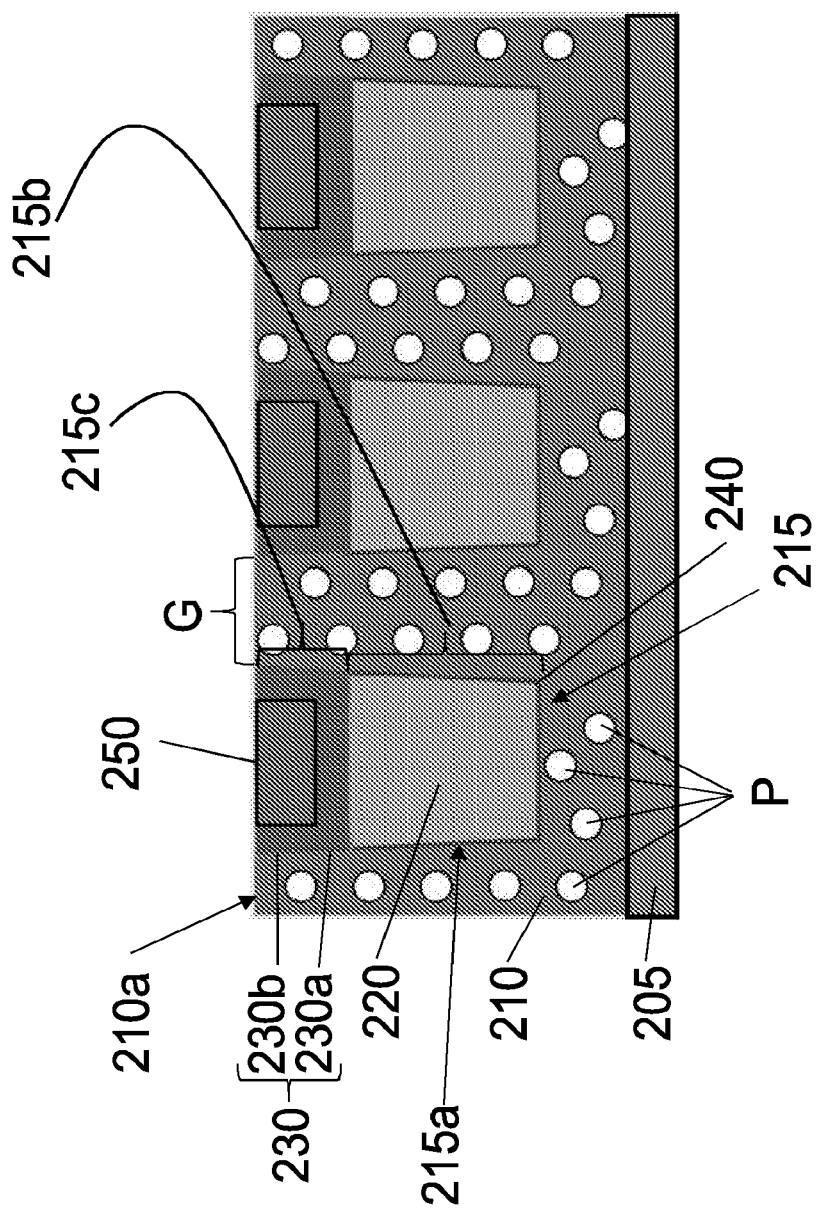
FIG. 2 illustrates a semiconductor device 200, according to an exemplary aspect of the present invention.

FIG. 2 illustrates a semiconductor device 200, according to an exemplary aspect of the present invention.

As illustrated in FIG. 2, the semiconductor device 200 includes a porous dielectric layer 210 formed on an interconnect layer 205 and including a recessed portion 215 (e.g., via, trench, etc.), a conductive interconnect metal 220 formed in the recessed portion 215, and a conformal (or semi-conformal) cap layer 230 formed on the porous dielectric layer 210 and on the conductive layer 220 in the recessed portion 215, an upper surface 210a of the porous dielectric layer 210 being exposed through a gap G in the conformal cap layer 230.

The interconnect layer 205 may include, for example, an underlying interconnect or contact level. Further, term "recessed portion" as used herein is defined as a via, trench or any other hole, cavity or depression formed in the porous dielectric layer.

As described in more detail below, in forming the semiconductor device 200, pores P in the porous dielectric layer 210 may be filled with a pore filling material (leave the porogen in at dielectric formation) to inhibit damage to the porous dielectric layer 210 during, for example, formation of the conductive layer 220. However, it is desirable to remove the pore filling material in order to reduce the dielectric constant of the porous dielectric layer 210. Therefore, after the forming of the conductive layer 220, the gap G in the conformal cap layer 230 may be used to allow the pore filling material to be burned out of the pores P of the porous dielectric layer 210.

That is, an exemplary aspect of the present invention uses a pore filler material to remain during metallization and chemical mechanical polishing (CMP) and takes advantage of the fully aligned via (FAV) process. The pores in the porous dielectric layer 210 may be interconnected. After CMP, the gap G provides a "window" to burn out the pore filler material or the porogen material in the pores P of the porous dielectric layer 210 through the interconnected pathways provided by the pores P. By burning out the pore filler at a later stage in the process flow, the low dielectric constant (e.g. <2.4) of the porous dielectric layer 210 could be regained, without exposing the conductive metal 220 during the burn out.

The porous dielectric layer 210 may be formed on an interconnect layer 205 (e.g., prior interconnect or contact level), and include, for example, a low-k dielectric material or an ultralow-k dielectric material. In particular, the porous dielectric layer 210 may include, for example, at least one of methyl silsesquioxane, hydrogen silsesquioxane, benzocyclobutene, silica and an aromatic thermoset polymer. A thickness of the porous dielectric layer 210 may be, for example, in a range from 60 nm to 200 nm.

An average pore diameter of pores P in the porous dielectric layer 210 may be, for example, greater than 0.5 nm and more particularly, in a range from 0.1 nm to 10 nm. Further, a porosity of the porous dielectric layer 210 may be in a range from 0.1 vol. % and about 50 vol. %.

As illustrated in FIG. 2, the semiconductor device 200 may include a plurality of recessed portions 215 formed in the porous dielectric layer 210. The plurality of the conductive layers 220 may be formed in the plurality of recessed portions 215, respectively.

The plurality of recessed portions 215 may be, for example, trenches with a long, narrow, rectangular cross-section, or a via (e.g., hole) having a circular, oval or square cross-section. Further, the recessed portion 215 may penetrate only a portion of the porous dielectric layer 210, or may penetrate an entirety of the porous dielectric layer 210 so that the bottom of the recessed portion 215 is connected to the interconnect layer 205 (e.g., prior interconnect or contact level).

The recessed portion 215 may also include a tapered sidewall 220a as illustrated in FIG. 2, or a vertical sidewall with no taper. The width of the conductive layer 220 may be in a range from 10 nm to 100 nm, and a depth of the conductive layer 220 measured from an upper surface 210a of the porous dielectric layer 210, may be in a range from 10 nm to 100 nm.

The recessed portion 215 may also include a lower portion 215b and an upper portion 215c which includes the conformal cap layer 230. The upper portion 215c may be filled, for example, in a different step than the lower portion 215b. Further, an interface between a bottom portion 230a of the conformal cap layer 230 and an upper surface of the conductive layer 220 may separate the upper portion 215c and lower portion 215b of the recessed portion 215.

Further, a barrier layer 240 may be formed on a wall of the lower portion 215b of the recessed portion 215, in which case, the conductive layer 220 may be formed on the barrier layer 240. The barrier layer may include at least one of TaN, TiN, Ru, Co, Ti and Ta, and have a thickness in a range from 1 nm to 10 nm. The uppermost portion of the barrier layer (i.e., the terminal portion) may be formed at the interface between the upper portion 215c and lower portion 215b of the recessed portion 215.

Further, the conductive layer 220 may include a metal such as copper, copper alloy, aluminum, aluminum alloy, ruthenium, cobalt or any other conductive metals. The conductive layer 220 may be, for example, a metal line or a metal interconnect.

As further illustrated in FIG. 2, the gap G in the conformal cap layer 230 may be formed at the upper surface 210a of the porous dielectric layer 210. In particular, the gap G (e.g., a plurality of gaps G) may be formed between the plurality of recessed portion 215.

A size of the gap G may correspond to (e.g., be equal to) a size of the exposed surface (e.g., exposed upper surface 210a) of the porous dielectric layer 210. In this case, the greater the size (e.g., length) of the gap G, the greater the size of the exposed surface of the porous dielectric layer 210 and, therefore the faster the pore-filling material can be burned out of the pores P at a given temperature.

Thus, although at a minimum, the gap G in the conformal cap layer 230 may have a length which is greater than an average pore diameter of pores P of the porous dielectric layer 210, the length of the gap G should more particularly, be in a range from 3 nm to 50 nm.

Referring again to FIG. 2, the conformal cap layer 230 may include at least one of silicon carbide, silicon nitride and silicon carbonitride, and have a thickness in a range from 5 nm to 20 nm. As noted above, an interface between the bottom portion 230a of the conformal cap layer 230 and the upper surface of the conductive layer 220 may separate the upper portion 215c and lower portion 215b of the recessed portion 215.

In addition, the conformal cap layer 230 may include a side portion 230b which may be substantially perpendicular to the bottom portion 230a, and which is formed on a sidewall of the upper portion 215c of the recessed portion 215. The uppermost surface of the side portion 230b may be substantially co-planar with the upper surface 210a of the porous dielectric layer 210. Further, the gap G may be formed between an edge of the uppermost surface of the side portion 230b of the conformal cap layer 230 in one recessed portion, and an edge of the uppermost surface of the side portion 230b of the conformal cap layer 230 in another recessed portion adjacent to the one recessed portion.

Referring again to FIG. 2, the semiconductor device 200 may also include an interlayer dielectric 250 formed on the conformal cap layer 230 in the recessed portion 215. The interlayer dielectric 250 may include, for example, silicon dioxide, and may fill a recess in the recessed portion 215 which is formed by an upper surface of the conformal cap layer 230. Further, an upper surface of the interlayer dielectric 250 may be co-planar with the uppermost surface of the side portion 230b of the conformal cap layer 230, and the upper surface 210a of the porous dielectric layer 210.

Figure 3:
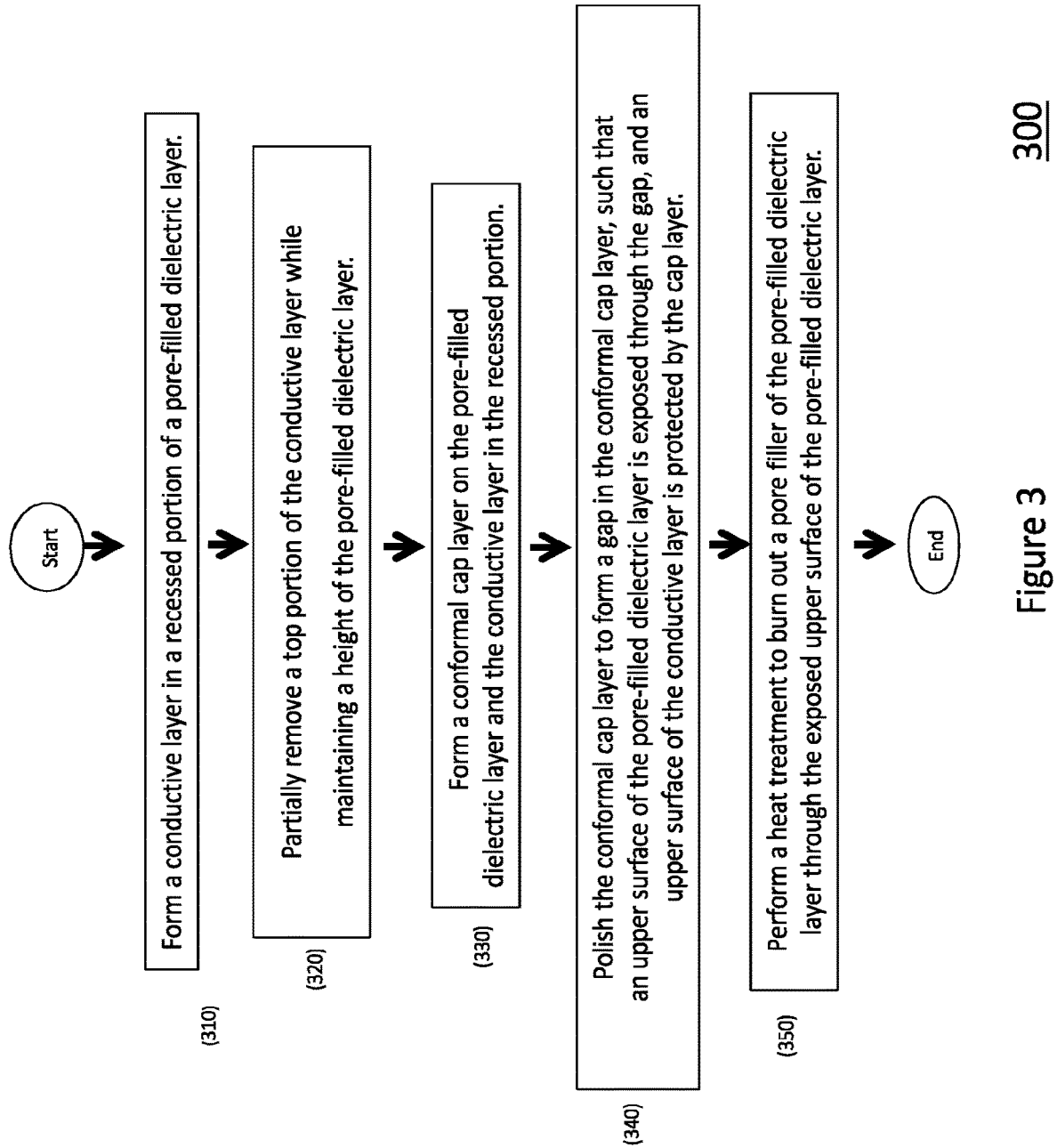
FIG. 3 illustrates a method 300 of forming a semiconductor device (e.g., semiconductor device 200) according to an exemplary aspect of the present invention.

Referring again to the drawings, FIG. 3 illustrates a method 300 of forming a semiconductor device (e.g., semiconductor device 200) according to an exemplary aspect of the present invention.

As illustrated in FIG. 3, the method 300 includes forming (310) a conductive layer in a recessed portion of a pore-filled dielectric layer, partially removing (320) a top portion of the conductive layer while maintaining a height of the pore-filled dielectric layer, forming (330) a conformal cap layer on the pore-filled dielectric layer and the conductive layer in the recessed portion, polishing (340) the conformal cap layer to form a gap in the conformal cap layer, such that an upper surface of the pore-filled dielectric layer is exposed through the gap, and an upper surface of the conductive layer is protected by the cap layer, and performing (350) a heat treatment (or UV light treatment) to burn out a pore filler of the pore-filled dielectric layer through the exposed upper surface of the pore-filled dielectric layer.

Referring again to the drawings, FIGS. 4A-4H illustrate a method 400 of forming a semiconductor device according to another exemplary aspect of the present invention.

Figure 4A:
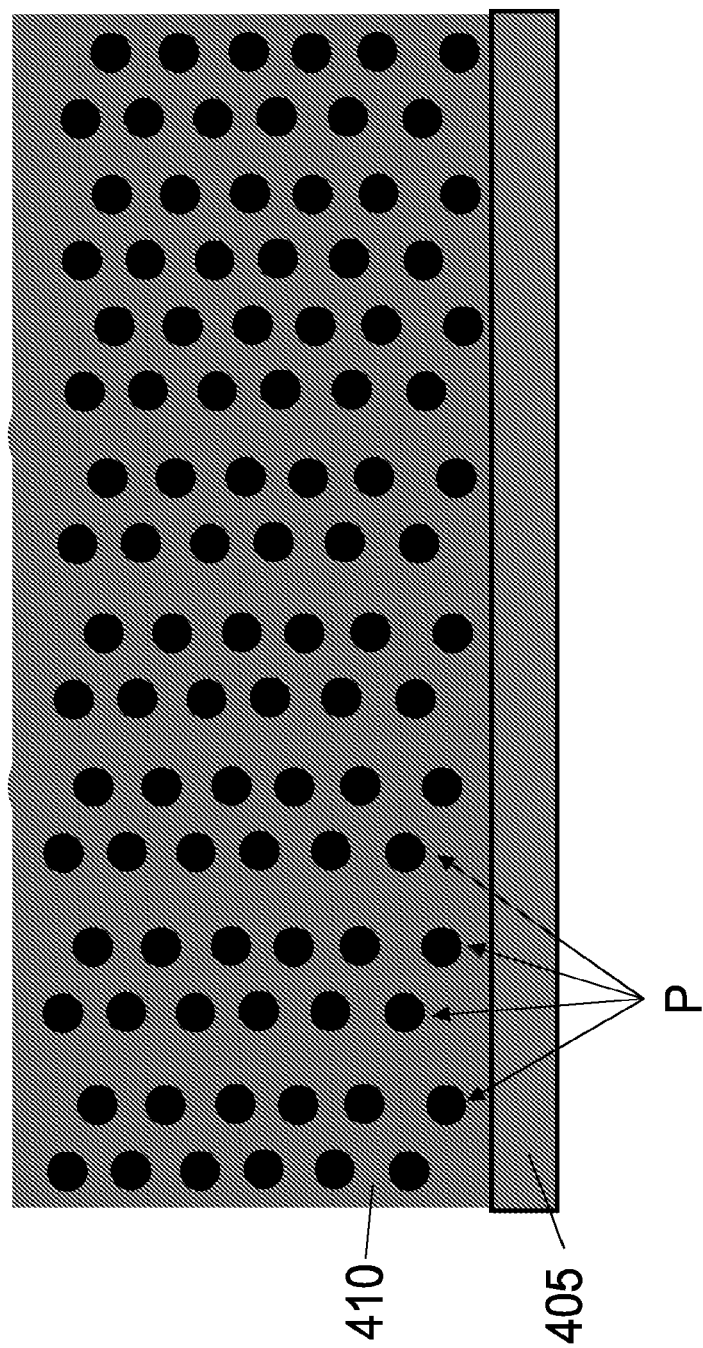
FIG. 4A illustrates forming a pore-filled dielectric layer 410 on an interconnect layer 405 (e.g., underlying interconnect or contact level), according to an exemplary aspect of the present invention.

In particular, FIG. 4A illustrates forming a pore-filled dielectric layer 410 on an interconnect layer 405 (e.g., prior interconnect or contact level), according to an exemplary aspect of the present invention.

The porous dielectric layer 210 may be formed on the interconnect layer 205, for example, by deposition (e.g., chemical vapor deposition (CVD)). The porous dielectric layer 210 may include, for example, a low-k dielectric material or an ultralow-k dielectric material. In particular, the porous dielectric layer 210 may include, for example, at least one of methyl silsesquioxane, hydrogen silsesquioxane, benzocyclobutene, silica and an aromatic thermoset polymer. A thickness of the porous dielectric layer 210 may be, for example, in a range from 60 nm to 200 nm.

The porous dielectric layer 210 includes a plurality of pores P which are filled with a pore-filling material, and may be interconnected. The pore-filling material may include, for example, a porogen such as a thermoplastic material.

An average pore diameter of pores P in the porous dielectric layer 210 may be, for example, greater than 0.5 nm and more particularly, in a range from 0.5 nm to 10 nm. Further, a porosity of the porous dielectric layer 210 may be in a range from 0.1 vol. % and about 50 vol. %.

Figure 4B:
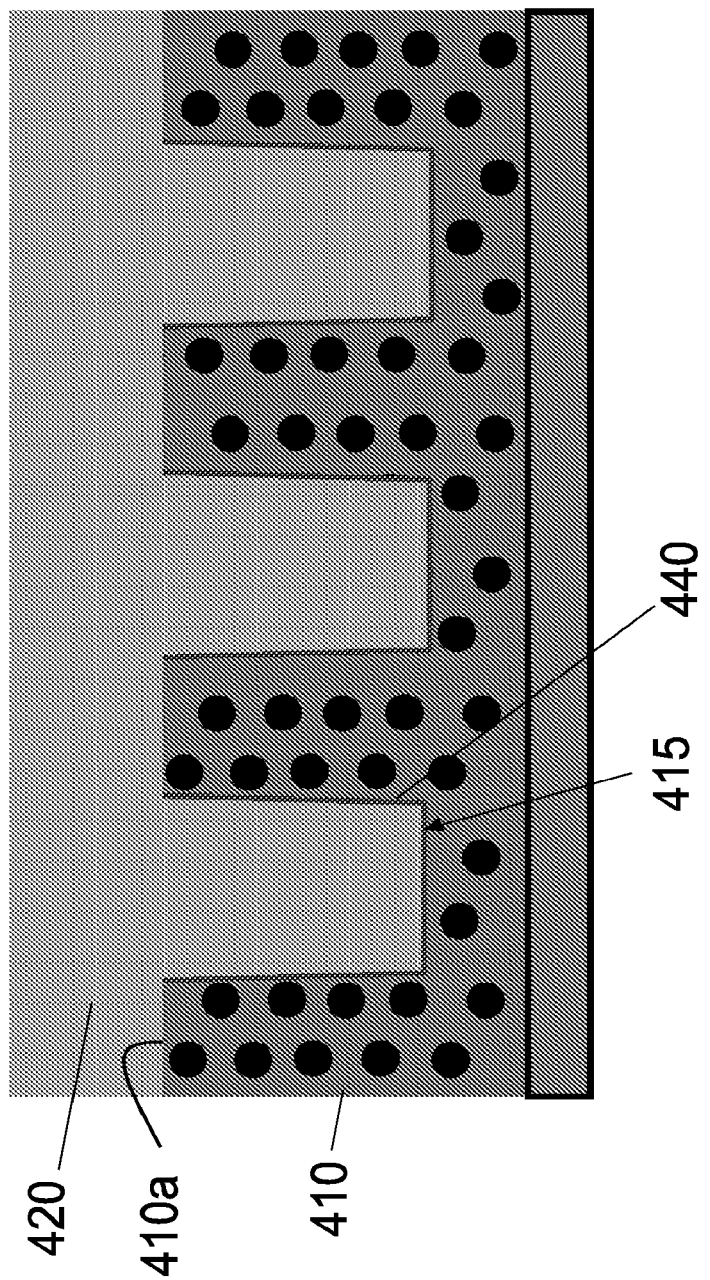
FIG. 4B illustrates an etching of the porous dielectric layer 410 to form the recessed portions 415, formation of the barrier layer 440, and forming of the conductive layer 420, according to an exemplary aspect of the present invention.

FIG. 4B illustrates an etching of the porous dielectric layer 410 to form the recessed portion 415 (e.g., plurality of recessed portions 415), formation of the barrier layer 440, and forming of the conductive layer 420, according to an exemplary aspect of the present invention.

The recessed portion 415 may be formed in the porous dielectric layer 410 by etching (e.g., reactive ion etching (RIE)). Conventionally, a porous dielectric layer would likely be damaged by this etching step. However, the pore-filling material in the pores P of the porous dielectric layer 410 helps to protect the porous dielectric layer 410 and inhibit damage to the porous dielectric layer 410 caused by this etching step.

The barrier layer 440 may be formed (e.g., conformally formed) on a wall of the recessed portion 415, for example, by CVD. The barrier layer 440 may include at least one of TaN, TiN, Ti and Ta, and have a thickness in a range from 1 nm to 10 nm. A portion of the barrier layer 440 may also be formed on the upper surface 410a of the porous dielectric layer 410, but will be removed in later step.

After the recessed portion 415 and barrier layer 440 are formed, a conductive layer 420 (e.g., metal layer) may be formed on the porous dielectric layer 410 and in the recessed portions 415 (e.g., on the barrier layer 440 in the recessed portion), for example, by CVD. The conductive layer 220 may include a metal such as copper, copper alloy, aluminum, aluminum alloy, or any combination of these materials. The conductive layer 220 may be, for example, a metal line or a metal interconnect.

Figure 4C:
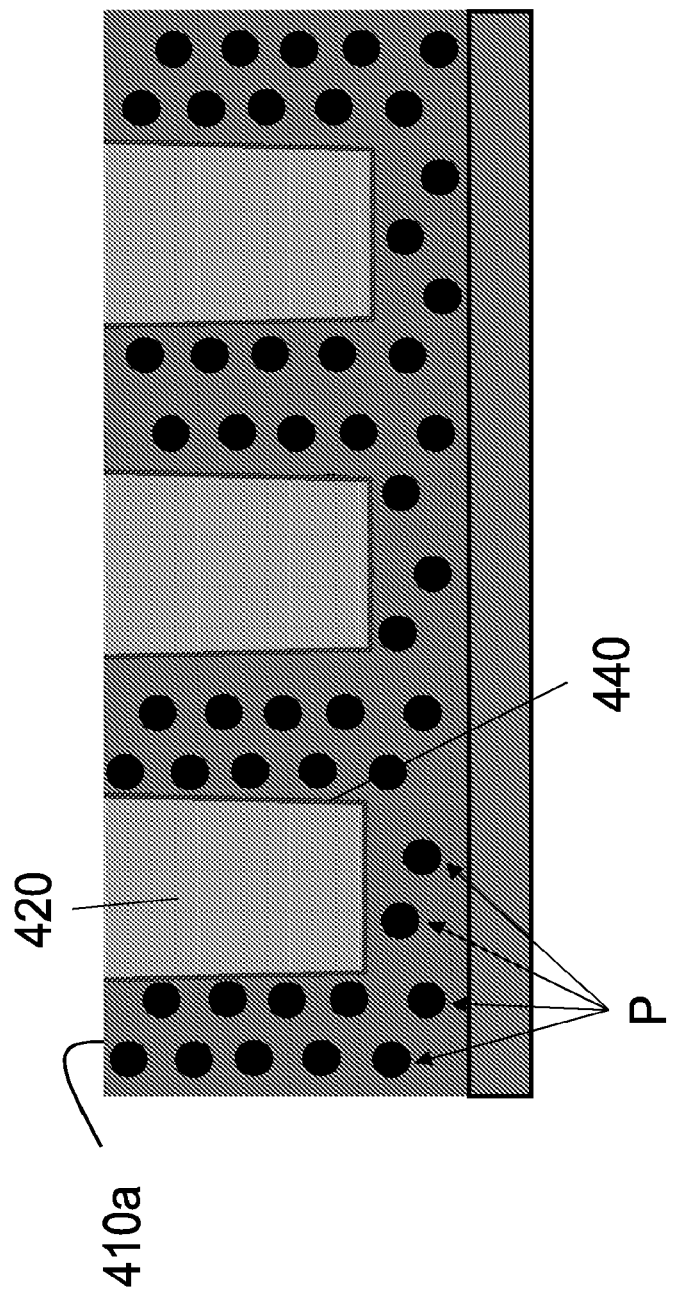
FIG. 4C illustrates a polishing (e.g., planarization) of the conductive layer 420, according to an exemplary aspect of the present invention.

FIG. 4C illustrates a polishing (e.g., planarization) of the conductive layer 420, according to an exemplary aspect of the present invention.

As illustrated in FIG. 4C, after the forming of the conductive layer 420, the conductive layer 420 may be polished by CMP to planarize the conductive layer 420. In this step, any barrier layer 440 material and any conductive layer 420 material which has been deposited on the upper surface 410a of the porous dielectric layer 410 may be removed by the CMP. After CMP, the upper surface 410a of the porous dielectric layer 410 may be co-planar with the upper surface of the conductive layer 420 and the uppermost portion of the barrier layer 440.

The pore-filling material in the pores P of the porous dielectric layer 410 helps to protect the porous dielectric layer 410 and inhibit damage to the porous dielectric layer 410 caused by this CMP step.

Figure 4D:
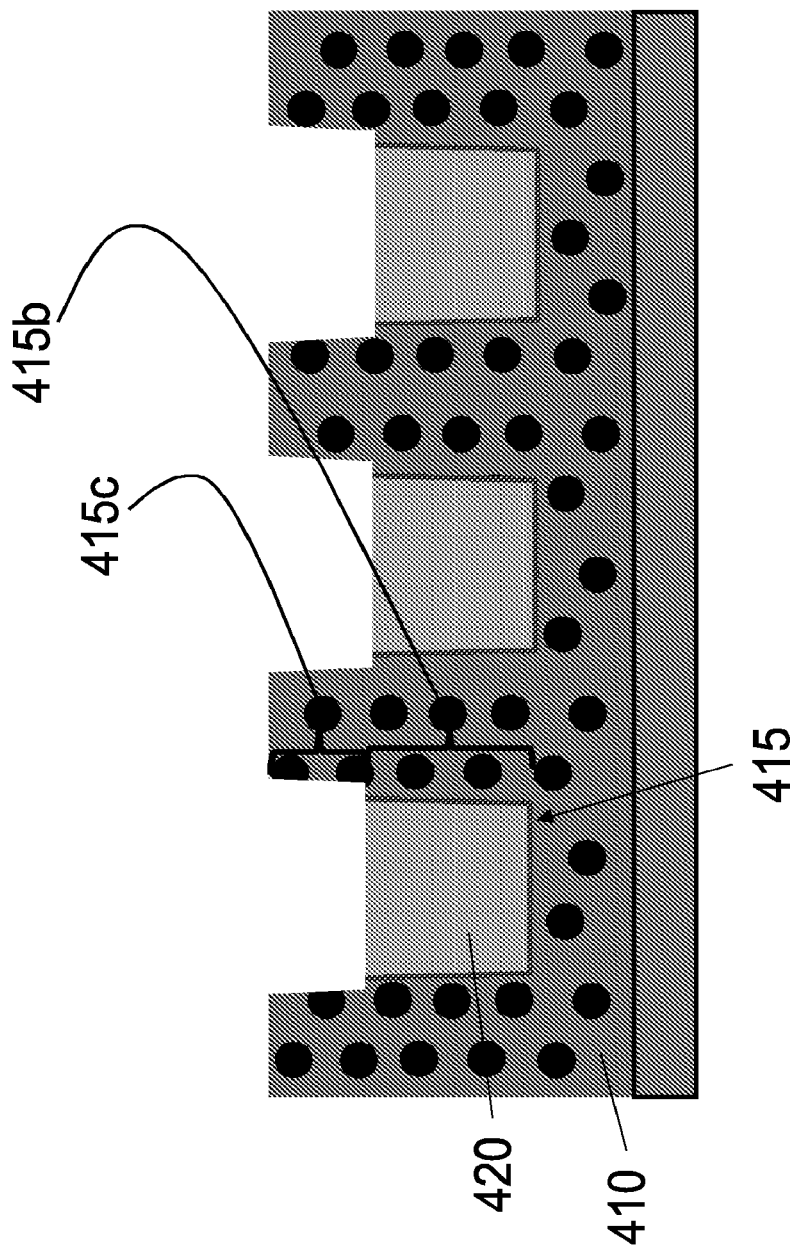
FIG. 4D illustrates the recessing of the conductive layer 420 and barrier layer 440, according to an exemplary aspect of the present invention.

FIG. 4D illustrates an etching of the conductive layer 420, according to an exemplary aspect of the present invention.

As illustrated in FIG. 4D, the conductive layer 420 and the barrier layer 440 in the recessed portion 415 may be etched in order to form an interconnect (e.g., a fully aligned via (FAV) recess interconnect) in the recessed portion 415. In particular, the conductive layer 420 and barrier layer 440 (e.g., liner) may be etched by wet etch and/or reactive ion etching (ME).

Further, the etching here may form an upper portion 415c of the recessed portion 415 which is wider than the original lower portion 415b of the recessed portion 415. That is, the etching may etch away a portion of the porous dielectric layer 410 on a sidewall of the upper portion of the recessed portion 415.

Figure 4E:
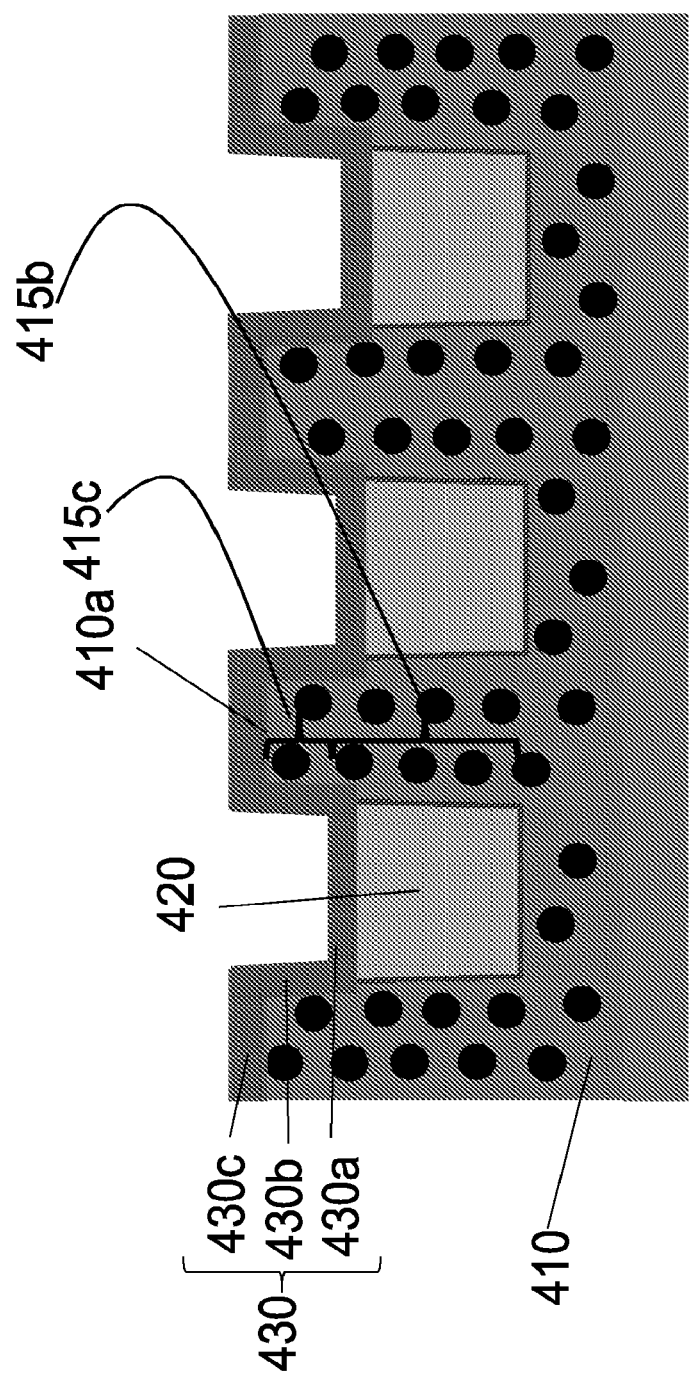
FIG. 4E illustrates a forming of a conformal cap layer 430, according to an exemplary aspect of the present invention.

FIG. 4E illustrates a forming of a conformal cap layer 430, according to an exemplary aspect of the present invention.

The conformal cap layer 420 may serve to protect the conductive layer 420 (e.g., metal such as copper) underlying the conformal cap layer 420. The conformal cap layer 420 may include at least one of silicon carbide, silicon nitride and silicon carbonitride, and have a thickness in a range from 5 nm to 20 nm. The conformal cap layer 420 may be formed, for example, by CVD.

As illustrated in FIG. 4E, the conformal cap layer 430 may include a bottom portion 430a formed on a surface of the conductive layer 420, a side portion 430b which may be substantially perpendicular to the bottom portion 430a, and which is formed on a sidewall of the upper portion 415c of the recessed portions 415, and a top portion 430c which is formed on the upper surface 410a of the porous dielectric layer 410.

Figure 4F:
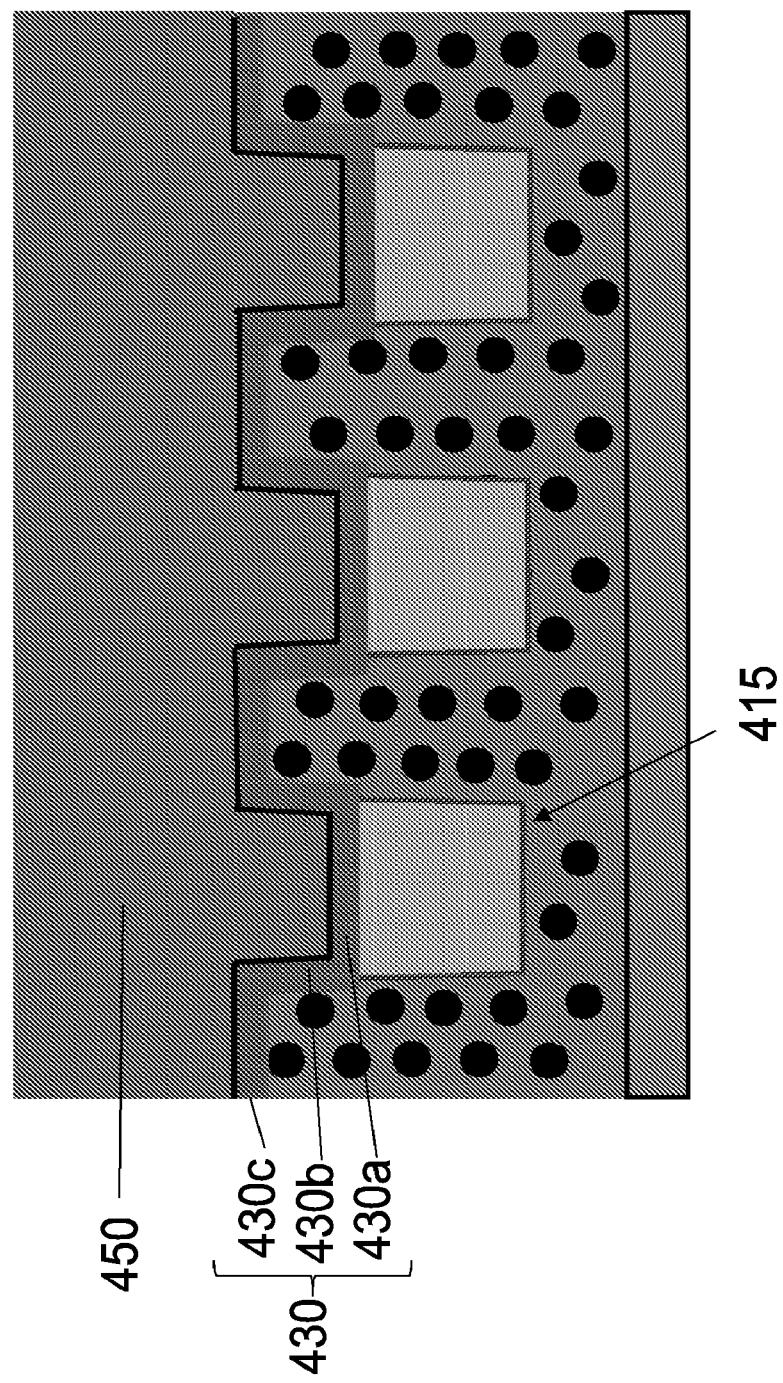
FIG. 4F illustrates a forming of an interlayer dielectric 450 (e.g., ILD fill) as a planarization layer, according to an exemplary aspect of the present invention.

FIG. 4F illustrates a forming of an interlayer dielectric 450 (e.g., ILD fill), according to an exemplary aspect of the present invention.

As illustrated in FIG. 4F, the interlayer dielectric 450 may be formed on the conformal cap layer 430 in the recessed portion 415 and outside of the recessed portion 415. The interlayer dielectric 450 may be formed, for example, by CVD.

The interlayer dielectric 450 may include, for example, silicon dioxide ($SiO_2$), silicon nitride (SiN) or silicon carbonitride (SiCN), and may fill a recess in the recessed portion 415 which is formed by an upper surface of the conformal cap layer 430.

Figure 4H:
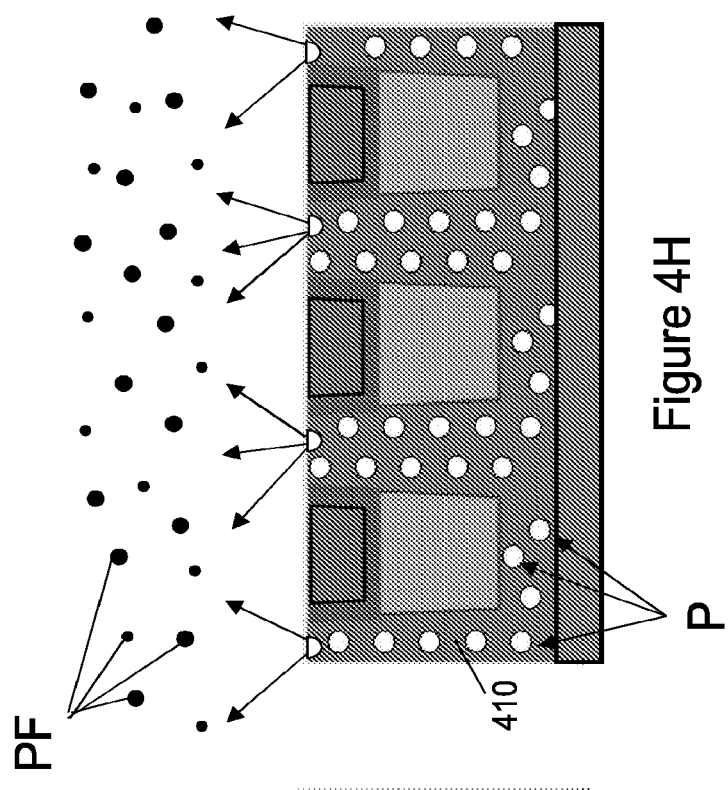
FIG. 4H illustrates a burn out of the pore filler PF from the pores P of the porous dielectric layer 410, according to an exemplary aspect of the present invention.
Figure 4G:
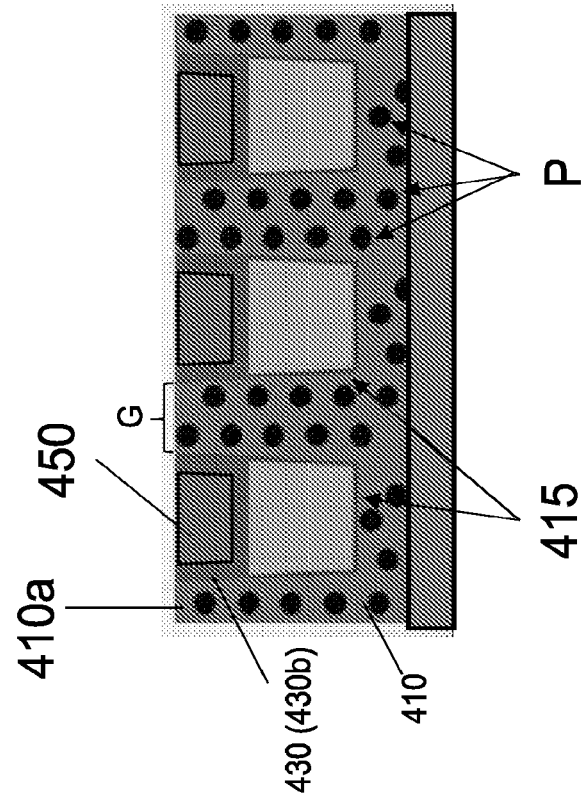
FIG. 4G illustrates a polishing (e.g., by CMP) of the interlayer dielectric 450 and the conformal cap layer 430, according to an exemplary aspect of the present invention.

FIG. 4G illustrates a polishing (e.g., by CMP) of the interlayer dielectric 450 and the conformal cap layer 430, according to an exemplary aspect of the present invention.

As illustrated in FIG. 4G, the interlayer dielectric 450 may be polished by CMP so that an upper surface of the interlayer dielectric 450 is co-planar with the uppermost surface of the side portion 430b of the conformal cap layer 430, and the upper surface 410a of the porous dielectric layer 410.

The polishing in this step may be continued until the top portion 430c of the conformal cap layer 430 is completely removed from the upper surface 410a of the porous dielectric layer 410, and at least one pore P is exposed at the upper surface 410. At this point, the gap G in the conformal cap layer 230 is formed between adjacent recessed portions 415 at the upper surface 210a of the porous dielectric layer 210. In particular, the gap G is formed between the side portions 430b of the adjacent recessed portions 415.

As also illustrated in FIG. 4G, this CMP step may also expose the upper surface 410a of the porous dielectric layer 410 outside of the plurality of recessed portions 415. These exposed portions of the upper surface 410a may also be used to provide a window for the pore filler to escape in a subsequent thermal treatment step.

A size of the gap G may correspond to (e.g., be equal to) a size of the exposed surface (e.g., exposed upper surface 410a) of the porous dielectric layer 410. In this case, the greater the size (e.g., length) of the gap G, the greater the size of the exposed surface of the porous dielectric layer 410 and, therefore the faster the pore-filling material can be burned out of the pores P at a given temperature.

Thus, although at a minimum, the gap G in the conformal cap layer 430 may have a length which is greater than an average pore diameter of pores P of the porous dielectric layer 410, the length of the gap G should more particularly, be at least 3 nm and, more particularly, in a range from 3 nm to 50 nm.

In practice, the size of the gap G should be set so that the pore filler can be burned out of the pores P at a reasonable temperature in a reasonable amount of time. The smaller the size of the gap G (i.e., the smaller the size of the exposed surface of the porous dielectric layer 410), the greater the temperature and time required to burn out the pore filler from the pores P.

FIG. 4H illustrates a burn out of the pore filler PF from the pores P of the porous dielectric layer 410, according to an exemplary aspect of the present invention.

As illustrated in FIG. 4H, after the CMP in FIG. 4G, a heat treatment may be performed in order to burn out a pore filler PF of the porous dielectric layer 410 through the open pores P (i.e., exposed pores) in the exposed upper surface 410a of the porous dielectric layer 410. A temperature of the heat treatment may be, for example, in a range from 200° C. to 450° C., and a duration of the heat treatment may be in a range from 1 minute to 30 minutes. The temperature for the burn out may depend on the pore filler but should be at least greater than the temperature at which the pore filler transitions to a vapor phase.

As noted above, instead of a heat treatment, an ultraviolet light (UV) light treatment may be used to extract the pore filler PF.

The heat treatment may be performed, for example, in a processing chamber such as a deposition chamber or vacuum chamber. A vacuum may be pulled in the chamber in order to help draw the pore filler PF out of the pores P in the porous dielectric layer 410.

The thermal treatment may be performed until the pore filler PF is completely removed from the pores P of the porous dielectric layer 410, which results in the semiconductor device (e.g., semiconductor device 200) of the present invention.

With its unique and novel features, the present invention provides a method of forming a semiconductor device which protects the porous dielectric material from damage caused by subsequent processing, and maintains a low dielectric constant of the porous dielectric material.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device comprising:
   a porous dielectric layer including an upper recessed portion and a lower recessed portion;
   a conductive layer disposed in the lower recessed portion;
   a cap layer disposed on sidewalls of the upper recessed portion and covering an upper surface of the conductive layer; and
   an interlayer dielectric disposed on the cap layer and filling a remainder of the upper recessed portion,
   wherein an upper surface of the porous dielectric layer is substantially coplanar with an upper surface of the interlayer dielectric.

2. The semiconductor device of claim 1, wherein the cap layer is a conformal dielectric layer.

3. The semiconductor device of claim 1, wherein an upper surface of the upper recessed portion is wider than an upper surface of the lower recessed portion.

4. The semiconductor device of claim 3, further comprising a fully aligned via, a lower portion of the fully aligned via disposed in a region of the upper recessed portion and contacting the conductive layer.

5. The semiconductor device of claim 1, wherein the cap layer comprises silicon, carbon, and nitrogen.

6. A semiconductor device comprising:
   a porous dielectric layer including an upper recessed portion and a lower recessed portion;
   a barrier layer disposed on sidewalls and on a lower surface of the lower recessed portion;
   a conductive layer disposed on the barrier layer and in the lower recessed portion, the conductive layer and opposing sidewall portions of the barrier layer each having an upper surface collectively defining an upper surface of the lower recessed portion;
   a cap layer disposed on sidewalls of the upper recessed portion and covering the upper surface of the lower recessed portion; and
   an interlayer dielectric filling a remainder of the upper recessed portion,
   wherein an upper surface of the porous dielectric layer is substantially coplanar with an upper surface of the interlayer dielectric.

7. The semiconductor device of claim 6, wherein the cap layer is a conformal dielectric layer.

8. The semiconductor device of claim 6, wherein an upper surface of the upper recessed portion is wider than the upper surface of the lower recessed portion.

9. The semiconductor device of claim 8, further comprising a fully aligned via, a lower portion of the fully aligned via disposed in a region of the upper recessed portion and contacting the conductive layer.

10. The semiconductor device of claim 6, wherein the cap layer comprises silicon, carbon, and nitrogen.

11. A semiconductor device comprising:
    a first recess within a porous dielectric layer having an upper and a lower recessed portion;
    a second recess within the porous dielectric layer having an upper and a lower recessed portion;
    a first metal line disposed in the lower recessed portion of the first recess;
    a second metal line disposed in the lower recessed portion of the second recess, wherein the first and second metal lines are adjacent and parallel;
    a first cap layer having first and second opposing sides and a bottom, disposed on the first metal line and on opposing sidewalls of the upper recessed portion of the first recess;
    a second cap layer having first and second opposing sides and a bottom, disposed on the second metal line and on opposing sidewalls of the upper recessed portion of the second recess;
    a first interlayer dielectric filling a remainder of the upper recessed portion of the first recess;
    a second interlayer dielectric filling a remainder of the upper recessed portion of the second recess; and
    a region of the porous dielectric layer between the upper recessed portion of the first recess and the upper recessed portion of the second recess having an upper surface that is substantially coplanar with an upper surface of the first and second interlayer dielectrics.

12. The semiconductor device of claim 11, wherein each of the first cap layer and the second cap layer is a conformal dielectric layer.

13. The semiconductor device of claim 11, further comprising:
    a first barrier layer having first and second opposing sides and a bottom, disposed on opposing sidewalls and on a lower surface of the lower recessed portion of the first recess, underlying the first metal line; and
    a second barrier layer having first and second opposing sides and a bottom, disposed on opposing sidewalls and on a lower surface of the lower recessed portion of the second recess, underlying the second metal line.

14. The semiconductor device of claim 13, wherein a first combined width of:
   (i) an upper surface of the first interlayer dielectric;
   (ii) an upper surface of the first cap layer on a sidewall of the upper recessed portion of the first recess; and
   (iii) an upper surface of the first cap layer on an opposing sidewall of the upper recessed portion of the first recess;
is wider than a second combined width of:
   (i) an upper surface of the first metal line;
   (ii) an upper surface of the first barrier layer on a sidewall of the lower recessed portion of the first recess; and
   (iii) an upper surface of the first barrier layer on an opposing sidewall of the lower recessed portion of the first recess.

15. The semiconductor device of claim 11, wherein a width of the upper surface of a region of the porous dielectric layer between the upper recessed portion of the first recess and the upper recessed portion of the second recess is between 3 nm to 50 nm.

16. The semiconductor device of claim 11, wherein the first and second cap layers comprise silicon, carbon, and nitrogen.

17. A semiconductor device comprising:
   a first trench within a porous dielectric layer having an upper and a lower trench portion;
   a second trench within the porous dielectric layer having an upper and a lower trench portion;
   a first metal line disposed in the lower trench portion of the first trench;
   a second metal line disposed in the lower trench portion of the second trench, wherein the first and second metal lines are adjacent and parallel;
   a first barrier layer having first and second opposing sides and a bottom, disposed on opposing sidewalls and on a lower surface of the lower trench portion of the first trench, underlying the first metal line;
   a second barrier layer having first and second opposing sides and a bottom, disposed on opposing sidewalls and on a lower surface of the lower trench portion of the second trench, underlying the second metal line;
   a first cap layer having first and second opposing sides and a bottom, disposed on the first metal line and on opposing sidewalls of an upper recessed portion of the first trench;
   a second cap layer having first and second opposing sides and a bottom, disposed on the second metal line and on opposing sidewalls of an upper recessed portion of the second trench;
   a first interlayer dielectric filling a remainder of the upper trench portion of the first trench;
   a second interlayer dielectric filling a remainder of the upper trench portion of the second trench; and
   a region of the porous dielectric layer between the upper trench portion of the first trench and the upper trench portion of the second trench having an upper surface that is substantially coplanar with an upper surface of the first and second interlayer dielectrics.

18. The semiconductor device of claim 17, wherein each of the first and the second cap layer is a conformal dielectric layer.

19. The semiconductor device of claim 17, wherein a first combined width of:
   (i) an upper surface of the first interlayer dielectric;
   (ii) an upper surface of the first cap layer on a sidewall of the upper recessed portion of the first trench; and
   (iii) an upper surface of the first cap layer on an opposing sidewall of the upper recessed portion of the first trench;
is wider than a second combined width of:
   (i) an upper surface of the first metal line;
   (ii) an upper surface of the first barrier layer on a sidewall of the lower trench portion of the first trench; and
   (iii) an upper surface of the first barrier layer on an opposing sidewall of the lower trench portion of the first trench.

20. The semiconductor device of claim 17, wherein a width of the upper surface of the region of the porous dielectric layer between the upper trench portion of the first trench and the upper trench portion of the second trench is between 3 nm to 50 nm.

21. The semiconductor device of claim 17, wherein the first and the second cap layers comprise silicon, carbon, and nitrogen.

* * * * *